United States Patent
Masaki et al.

(10) Patent No.: US 7,601,281 B2
(45) Date of Patent: Oct. 13, 2009

(54) PRODUCTION METHOD OF ANISOTROPIC CONDUCTIVE SHEET

(75) Inventors: Toshiaki Masaki, Ibaraki (JP); Kenichi Ikeda, Ibaraki (JP); Osamu Maekawa, Toyohashi (JP); Yasuo Nakatasuka, Ibaraki (JP); Masataka Tada, Ibaraki (JP)

(73) Assignee: Nitto Denko Corporation, Ibaraki-shi (JP)

(*) Notice: Subject to any disclaimer, the term of this patent is extended or adjusted under 35 U.S.C. 154(b) by 605 days.

(21) Appl. No.: 11/236,249

(22) Filed: Sep. 26, 2005

(65) Prior Publication Data

US 2006/0065995 A1 Mar. 30, 2006

(30) Foreign Application Priority Data

Sep. 27, 2004 (JP) .............................. 2004-279902

(51) Int. Cl.
*H01L 29/82* (2006.01)
*H01L 23/50* (2006.01)
*H01F 7/02* (2006.01)
*B29C 47/00* (2006.01)
*B29C 70/62* (2006.01)

(52) U.S. Cl. ..................... 264/108; 264/427; 264/437

(58) Field of Classification Search ................. 264/427, 264/435, 464, 470, 485, 496, 108, 165, 177.2, 264/402, 1.36, 439, 71, 440, 437

See application file for complete search history.

(56) References Cited

U.S. PATENT DOCUMENTS 4,292,261 A 9/1981 Kotani et al.
4,778,635 A * 10/1988 Hechtman et al. ........... 264/437

FOREIGN PATENT DOCUMENTS

| JP | 51-93393 A | 8/1976 |
|---|---|---|
| JP | 53-147772 A | 12/1978 |
| JP | 54-146873 A | 11/1979 |
| JP | 56-48951 B2 | 11/1981 |
| JP | 04-151889 A | 5/1992 |
| JP | 07-105741 A | 4/1995 |
| JP | 11-260518 A | 9/1999 |
| JP | 2000-133063 A | 5/2000 |
| JP | 2001-050983 A | 2/2001 |
| JP | 2001-185261 A | 7/2001 |
| JP | 2003021648 A * | 1/2003 |

* cited by examiner

*Primary Examiner*—Joseph S. Del Sole
*Assistant Examiner*—Nahida Sultana
(74) *Attorney, Agent, or Firm*—Leydig, Voit & Mayer, Ltd.

(57) ABSTRACT

A flowable insulating resin 1 is placed in a sheet-like molding die space and conductive magnetic particles 2 are dispersed in the insulating resin 1. A first magnetic field G1 is acted in the sheet thickness direction on the position where a conductive path is to be formed in the die space, and conductive magnetic particles 2a are locally collected together to form a conductive path. Simultaneously, a second magnetic field G2 is acted in the sheet thickness direction on the intermediate region and the magnetic field G2 is moved in the lateral direction to move conductive magnetic particles 2b left in the intermediate region to join the collection forming the conductive path. As a result, the number of the conductive magnetic particles left in the insulating resin becomes smaller.

14 Claims, 7 Drawing Sheets

(a)

(b)

(c)

(d)

(a)

(b)

PRODUCTION METHOD OF ANISOTROPIC CONDUCTIVE SHEET

FIELD OF THE INVENTION

The present invention relates to an anisotropic conductive sheet to be interposed for mounting of electronic parts such as integrated circuits. The anisotropic conductive sheet produced by the method of the present invention can additionally be used as an electrical connection between printed circuit boards and related electronic components.

BACKGROUND OF THE INVENTION

Anisotropic conductive sheets (also called anisotropic conductive films) having various structures are shown in the following references 1-9:
   reference 1: JP-A-51-93393
   reference 2: JP-A-53-147772
   reference 3: JP-A-54-146873
   reference 4: JP-B-56-48951
   reference 5: JP-A-4-151889
   reference 6: JP-A-7-105741
   reference 7: JP-A-2000-133063
   reference 8: JP-A-2001-185261
   reference 9: U.S. Pat. No. 4,292,261

As shown in FIG. 6(a), in an anisotropic conductive sheet 100 comprising conductive particles 102 uniformly dispersed in an insulating resin sheet 101, respective conductive particles 102 are separated from each other in an unused (non-compressed) state. As shown in FIG. 6(b), however, when the anisotropic conductive sheet 100 is interposed between an electrode 111 of an electronic part 110 to be connected and a wire circuit 121 of a substrate 120 for mounting, and compressed from both sides, the conductive particles are contacted with each other in the compressed part to electrically conduct the electrode 111 and the circuit 121.

In the anisotropic conductive sheet shown in FIG. 6(c), (d), a number of conductive paths 103, 104 penetrating an insulating resin sheet 100 in the thickness direction of the sheet have been formed, wherein the conductive paths are insulated from each other.

The conductive paths include a through-hole filled with a good conductor metal, a through-hole having a metal conductive wire penetrating the insulating resin sheet, as shown in FIG. 6(c), and conductive magnetic particles locally collected together to form a conductive path as shown in FIG. 6(d).

Conventionally, the following production method is used for producing the anisotropic conductive sheet shown in FIG. 6(d).

First, as shown in FIG. 7(a), a flowable insulating resin 101a is placed in a sheet-like molding die (sheet-like cavity space defined by partition plates 201, 202 in the Figure). The insulating resin 101a contains conductive magnetic particles 102 in a uniformly dispersed state.

Next, magnets M1 and M2 are placed in positions facing each other relative to the insulating resin in the die, where the conductive path is to be formed, and a local magnetic field is allowed to act on the sheet in the thickness direction (magnetic field lines are shown with a broken arrow in the Figure). As shown in FIG. 7(a), uniformly dispersed conductive magnetic particles 102 are attracted toward the local magnetic field and, as shown in FIG. 7(b), are collected together to form a conductive path.

Finally, the insulating resin is cured (set) to give an anisotropic conductive sheet.

However, the present inventors considered the above-mentioned conventional production methods in more detail and found the following problems.

As shown in FIG. 7(a), the conductive magnetic particles 102 can be attracted toward the central direction when a local magnetic field is applied to the insulating resin in the die, since the magnetic field between the opposing magnets is extending in the initial stage.

As the conductive magnetic particles 102a are collected together as a conductive path, as shown in FIG. 7(b), the conductive path becomes a magnetic path and, since the magnetic field is confined in the conductive path, the magnetic field can hardly act on the surrounding area. As a result, a lot of conductive magnetic particles 102b are left dispersed in the insulating resin, as shown in FIG. 7(b). The conductive magnetic particles 102b left behind are not attracted to the conductive path, and merely disperse in the film without contributing to the conductive path.

Therefore, the problem that the present inventors found in the conventional production methods is that a portion of the conductive magnetic particles is left dispersed in the insulating resin instead of being incorporated into the conductive paths.

Since conductive magnetic particles are left in the insulating resin, problems occur in the anisotropic conductive sheets produced by conventional methods. More specifically, (a) a preferable conductive path having a sufficient sectional area cannot be obtained and (b) reliability in the insulation between conductive paths is impaired due to the remaining conductive magnetic particles.

Even if a greater amount of conductive particles is dispersed in the insulating resin to solve the above-mentioned problem (a), the number of the remaining conductive magnetic particles increases and the problem of reliability relating to the above-mentioned (b) becomes greater.

It is therefore an object of the present invention to solve the above-mentioned problems and reduce the number of conductive magnetic particles left in the insulating resin in the production of an anisotropic conductive sheet comprising conductive magnetic particles locally collected together.

SUMMARY OF THE INVENTION

The present invention is characterized by the following.

(1) A method of producing an anisotropic conductive sheet (A), which method comprises (a) placing a flowable insulating resin in the space of a sheet-like molding die, wherein the flowable insulating resin has conductive magnetic particles dispersed therein, (b) simultaneously performing, relative to the space of the sheet-like molding die, the processes of (i) applying, in a sheet thickness direction, a first magnetic field to a position in the space of the sheet-like molding die to locally collect the conductive magnetic particles together to form a conductive path, and (ii) applying, in the sheet thickness direction, a second magnetic field to a region in the space of the sheet-like molding die and moving the second magnetic field in the sheet surface expanding direction to move the conductive magnetic particles in the region to the conductive path formed in (i), and (c) solidifying the flowable insulating resin to produce an anisotropic conductive sheet comprising an insulating resin sheet and conductive magnetic particles contained in the sheet, wherein the conductive magnetic particles are locally collected together to form multiple conductive paths penetrating the insulating resin sheet in the thickness direction.

(2) The production method of (1) above, wherein the above-mentioned process (i) is performed by placing, according to the arrangement pattern of the conductive path, a first magnet in or behind a first main wall surface of two main wall surfaces forming the space of the sheet-like molding die, when seen from the space of the sheet-like molding die, and the above-mentioned process (ii) is performed by placing a second magnet behind the above-mentioned first magnet or behind a second main wall surface opposite the above-mentioned first main wall surface, when seen from the space of the sheet-like molding die, and moving the second magnet in the sheet surface expanding direction.

(3) The production method of (2) above, wherein the above-mentioned process (i) is performed by placing, according to the arrangement pattern of the conductive path, the first magnet behind the first main wall surface, when seen from the space of the sheet-like molding die, and the above-mentioned process (ii) is performed by placing the second magnet behind the above-mentioned first magnet, when seen from the space of the sheet-like molding die, and moving the second magnet in the sheet surface expanding direction.

(4) The production method of (3) above, wherein a die member forming at least the above-mentioned first main wall surface is made of a material permitting passage of a magnetic field from behind.

(5) The production method of (2) above, wherein the above-mentioned process (i) is performed by placing, according to the arrangement pattern of the conductive path, the first magnet behind the first main wall surface, when seen from the space of the sheet-like molding die, and the above-mentioned process (ii) is performed by placing the second magnet behind the above-mentioned second main wall surface, when seen from the space of the sheet-like molding die, and moving the second magnet in the sheet surface expanding direction.

(6) The production method of (5) above, wherein die members forming the first and the second main wall surfaces are made of a material permitting passage of a magnetic field from behind.

(7) The production method of (1) above, wherein the above-mentioned process (i) is performed by placing, according to the arrangement pattern of the conductive path, a first magnet in or behind a first main wall surface of two main wall surfaces forming the space of the sheet-like molding die, when seen from the space of the sheet-like molding die, and the above-mentioned process (ii) is performed by arranging multiple electromagnets as second magnets in the sheet surface expanding direction behind the above-mentioned first magnet or behind a second main wall surface opposite the above-mentioned first main wall surface, when seen from the space of the sheet-like molding die, and moving the second magnetic field in the sheet surface expanding direction by controlling the order of activation of individual electromagnets.

(8) The production method of (7) above, wherein the above-mentioned process (i) is performed by placing, according to the arrangement pattern of the conductive path, the first magnet behind the first main wall surface when seen from the space of the sheet-like molding die, and the above-mentioned process (ii) is performed by arranging the multiple electromagnets as second magnets in the sheet surface expanding direction behind the above-mentioned first magnet, when seen from the space of the sheet-like molding die, and by moving the second magnetic field in the sheet surface expanding direction by controlling the order of activation of individual electromagnets.

(9) The production method of (8) above, wherein a die member forming at least the first main wall surface is made of a material permitting passage of a magnetic field from behind.

(10) The production method of (7) above, wherein the above-mentioned process (i) is performed by placing, according to the arrangement pattern of the conductive path, the first magnet behind the first main wall surface, when seen from the space of the sheet-like molding die, and the above-mentioned process (ii) is performed by arranging the multiple electromagnets as second magnets in the sheet surface expanding direction behind the other main wall surface, when seen from the space of the sheet-like molding die, and by moving the second magnetic field in the sheet surface expanding direction by controlling the order of activation of individual electromagnets.

(11) The production method of (10) above, wherein die members forming the first and the second main wall surfaces are made of a material permitting passage of a magnetic field from behind.

(12) The production method of (1) above, further comprising placing, according to the arrangement pattern of the conductive path, a first material for generating the first magnetic field in or behind the plane of a first main wall surface of two main wall surfaces forming the space of the sheet-like molding die, when seen from the space of the sheet-like molding die, and placing a second material for generating the second magnetic field adjacent to the first material so as to fill the gap formed by placement of the first aforementioned first material, wherein the first material and the second material both permit passage of a magnetic field, and the first material is made to have higher permeability than the second material, and wherein the above-mentioned processes (i) and (ii) are simultaneously performed by moving a magnet in the sheet surface expanding direction behind the first and second materials to generate a magnetic field, which is passed through the first material to create a first magnetic field, and through the second material to create a second magnetic field, wherein the first and the second magnetic fields simultaneously act on the space of the sheet-like molding die.

(13) The production method of (12) above, wherein the first material and the second material are placed behind the first main wall surface, when seen from the space of the sheet-like molding die, and a die member forming at least the aforementioned first main wall surface is made of a material permitting passage of a magnetic field from behind.

(14) The production method of (12) above, wherein the first material is iron, nickel, cobalt or ferrite and the second material is aluminum, copper or silica.

(15) The production method of (1) above, wherein at least the sheet-like molding die, the source of the first magnetic field and the source of the second magnetic field are partially or wholly surrounded by a magnetic material so that the first magnetic field and the second magnetic field will act more intensely on the space of the sheet-like molding die.

(16) The production method of (1) above, further comprising adding mechanical vibration to the space of the sheet-like molding die to facilitate the above-mentioned process (ii).

The symbols in the Figures show the following: 1; insulating resin, 2; conductive magnetic particles, 2a; conductive magnetic particles collected together as a conductive path, 2b; left conductive magnetic particles, G1; first magnetic field, g1; first magnet, G2; second magnetic field, g2; a second magnet.

DETAILED DESCRIPTION OF THE INVENTION

In the production method of the present invention, conductive magnetic particles are dispersed within a flowable insulating resin, and a first magnetic field is applied to form a conductive path in a fixed position relative to the flowable insulating resin in the molding die as shown in the above-mentioned (1). Simultaneously, the second magnetic field is movably applied to draw the conductive magnetic particles left from the collection of conductive magnetic particles (i.e., conductive path formation) produced by the first magnetic field, and lead them to be included in the conductive path.

By doubly applying these two kinds of magnetic fields having different objects and actions, the number of conductive magnetic particles left in a region between the positions wherein the first magnetic field is applied can be decreased and the conductive path becomes thicker. Therefore, the anisotropic conductive sheet produced by the method of the present invention has improved conductivity in the thickness direction and insulating properties in the sheet surface expanding direction.

Figure 1:
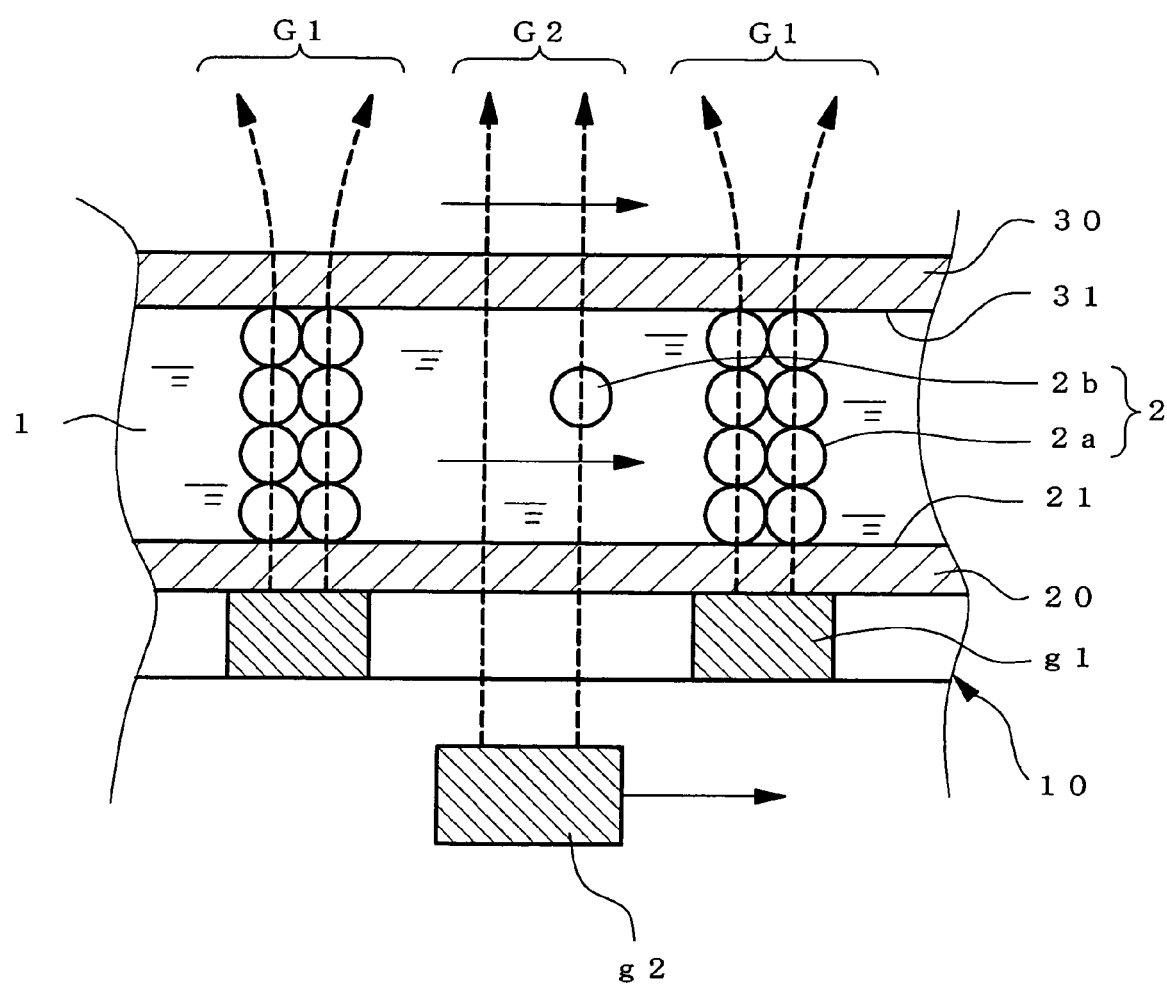
FIG. 1 schematically shows the state where a magnetic field is applied according to the production method of the present invention, wherein the first magnet and the second magnet are hatched to distinguish other parts.

FIG. 1 schematically shows the production method of the present invention. As shown in this Figure, in this production method, a flowable insulating resin 1 is placed in a sheet-like molding die (molding cavity) formed by two pieces of plate die members 20 and 30. The insulating resin 1 comprises conductive magnetic particles 2 dispersed therein (in this Figure, they are already locally collected together).

The flowable insulating resin 1 in the sheet-like molding die is simultaneously subjected to the following processes (i) and (ii).

(i) A first magnetic field G1 is applied in the sheet thickness direction to a position in a space of the sheet-like molding die where a conductive path is to be formed, and conductive magnetic particles 2a are locally collected together to form a conductive path.

(ii) A second magnetic field G2 is applied to a region in the space of the sheet-like molding die, in the sheet thickness direction, and the second magnetic field is moved in the sheet surface expanding direction. As a result, conductive magnetic particles 2b left (or being left) in the region are drawn into the collection of conductive magnetic particles forming a conductive path.

After the conductive path is formed, the insulating resin 1 is solidified to produce an anisotropic conductive sheet.

The anisotropic conductive sheet formed by the production method of the present invention may be any suitable anisotropic conductive sheet provided that it comprises an insulating resin sheet and conductive magnetic particles contained in the sheet, wherein the conductive magnetic particles are locally collected together to form multiple conductive paths penetrating the insulating resin sheet in the thickness direction. The preferable size, structure, and material embodiments are exemplified below.

The insulating resin employed as a starting material may be any suitable insulating resin as long as it can be flowable at least during the above-mentioned processes (i) and (ii), and can be solidified as a sheet after processing. Suitable insulating resins for use in the method of the present invention include thermoplastic resins, thermosetting resins, UV curable resins and similar flowable resins.

Exemplary thermoplastic resins include polyester, nylon, and polyolefin. Exemplary UV curable resins include epoxy resin and acrylic resin and exemplary thermosetting resins include epoxy resin and acrylic resin.

The thickness of the anisotropic conductive sheet is not particularly limited. In one embodiment the anisotropic conductive sheet produced by the method of the present invention, is preferably 10 μm-50 μm thick, as in conventional anisotropic conductive sheets. More preferably, the anisotropic conductive sheet is 10 μm-25 μm thick, a thickness often used for mounting recent integrated circuit chips comprising electrodes at high density.

The outline shape and outside dimension of the anisotropic conductive sheet as a product before cutting as obtained by the production steps or the final product can be respectively determined according to the production instruments, processability, and the size of electronic parts and circuit substrates to be connected.

For example, in one embodiment the outside dimension of the anisotropic conductive sheet before cutting can be a 50 mm wide band like sheet (provided by unwinding a roll). In another embodiment, the anisotropic conductive sheet can be a 100 mm×100 mm sheet. Further, in yet another embodiment, the outside dimension of an anisotropic conductive sheet as the final product can be about (30 mm×50 mm)-(0.5 mm×5 mm) when the shape is a rectangle.

The arrangement pattern of the conductive paths, cross sectional shapes of the conductive paths, average outer diameter, the ratio of the section of the conductive path to the sheet surface and other conductive path properties can be determined upon review of the anisotropic conductive sheet surface by reference to the designed values of conventionally known anisotropic conductive sheets.

In addition, elastic coefficient, heat resistance, other mechanical properties, electric properties, and chemical properties of the anisotropic conductive sheet as a whole can be determined by reference to the properties of conventionally known anisotropic conductive sheets, or determined to satisfy the industrially demanded properties.

The material employed to produce the conductive magnetic particles, particle diameter, production method of particles, amount to be added, and kneading method of the conductive magnetic particles contained in the anisotropic conductive sheet can be determined by reference to known techniques.

For example, suitable materials for the conductive magnetic particles include conductive magnetic metals such as iron and nickel, as well as magnetic particles containing non-conductive magnetic materials (e.g., ferrite etc.) coated with a conductive substance (e.g., gold, silver etc.).

The particle size of the conductive magnetic particles is preferably about 0.1 μm-5 μm, as measured by a light scattering method.

The method for applying the first magnetic field and the second magnetic field to the space in a sheet-like molding die, where an insulating resin is placed, is explained below.

The space of the sheet-like molding die to be used in the present invention may have any sheet-like shape as long as it can mold the object anisotropic conductive sheet. The space of the sheet-like molding die may be a closed type molding die cavity completely surrounding the main surfaces on the both sides and outer circumference of an anisotropic conductive sheet, or it may be a space contained in a die structure comprising a sheet-like insulating resin containing conductive magnetic particles dispersed therein and two pieces of sheet-like die member sandwiching the resin from both sides, wherein the space is defined by the two pieces of sheet-like die member.

In the example of FIG. 1, the inside space sandwiched by two parallel pieces of sheet-like die members 20 and 30 is the space of the sheet-like molding die.

The method for placing a flowable insulating resin (including conductive magnetic particles) in the space of the sheet-like molding die can be determined by reference to the conventionally known molding techniques and, for example, the following methods can be mentioned.

A method comprising injecting a flowable material made of a mixture of a flowable insulating resin and conductive magnetic particles into a space of the sheet-like molding die.

A method comprising preparing a sheet-like member of a thermoplastic resin material (solid) containing conductive magnetic particles dispersed therein and melting the same in a space of the sheet-like molding die.

A method comprising placing a mixture of a resin powder or granule and conductive magnetic particles in a space of the sheet-like molding die and melting the same in a space of the sheet-like molding die.

As a mold structure to apply at least the first magnetic field to the space of the sheet-like molding die, the following can be mentioned.

Figure 2:
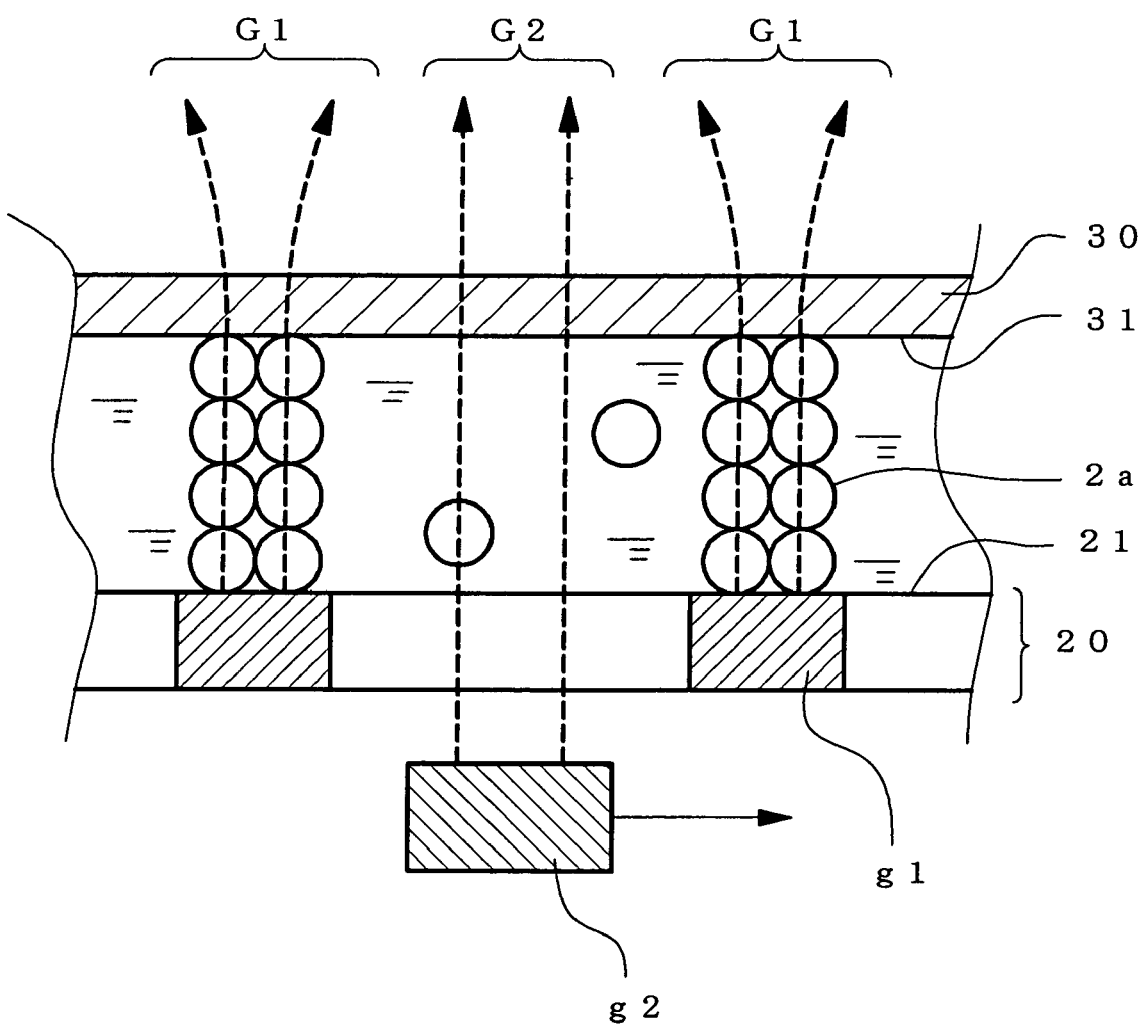
FIG. 2 shows another embodiment of the production method of the present invention wherein a first magnet is disposed in a first main wall surface.

A structure shown in FIG. 2, wherein a first magnet g1 is disposed in a first main wall surface (downside inner wall surface 21 in the Figure) of the two main wall surfaces 21 and 31 corresponding to the surface of an anisotropic conductive sheet, from the main wall surfaces forming the space of the sheet-like molding die. To be specific, it is a structure wherein a first main surface 21 of the space of the sheet-like molding die is the main surface of a plate die member 20 and the first magnet g1 is embedded in the die member 20. As a result, the first magnet g1 is exposed in the space of the sheet-like molding die and brought into contact with the insulating resin.

A structure shown in FIG. 1, wherein the first main wall surface 21 consists of a plate die member 20 and the first magnet g1 is disposed behind the die member 20 when seen from the space of the sheet-like molding die.

The embodiment of FIG. 1 is preferable in view of easy handling.

In the embodiment of FIG. 1, the material of the die member 20 on the first main surface 21 should be able to pass the magnetic fields G1 and G2 from behind. When the insulating resin is melted by heating, the material of the die member 20 should have suitable heat resistance.

Any suitable die member material can be employed in the method of the present invention. Exemplary die member materials include polyimide and polyester.

In one embodiment, the thickness of the plate die member is preferably about 0.01 mm-0.02 mm in consideration of the diffusion of a magnetic field.

The structure and material of the die member 30 forming the second main wall surface 31 opposite the first main wall surface 21, as shown in FIGS. 1 and 2 are not particularly limited. Use of a magnetic material enables sharp collection of conductive magnetic particles, because the first magnetic field passes the space of the sheet-like molding die without extending.

Exemplary magnetic materials for the die members include iron, nickel, and ferrite.

The first magnet only needs to be disposed according to the arrangement pattern of the conductive path to be formed in the anisotropic conductive sheet.

The cross sectional shape of the first magnet (sectional shape when cut along the plane parallel to the first main surface) preferably matches the cross sectional shape of the conductive path. However, it may be smaller than the cross sectional shape of the conductive path.

The first magnet may be placed not only on the first main wall surface side of the space of the sheet-like molding die, but may be also placed on the second main wall surface side opposite to the magnetic pole of the first magnet, as in the conventional techniques. However, such opposite arrangement makes alignment of the magnetic poles facing each other difficult, and the number of the parts problematically increases.

Therefore, a preferred embodiment of the present invention comprises placing the first magnet on the first main wall surface side of the space of the sheet-like molding die.

The first magnet and the second magnet may be any suitable permanent magnets and electromagnets.

The intensity of the first magnetic field to be applied to the space of the sheet-like molding die is preferably high so that the arrangement of the conductive magnetic particles can be retained, and can be adjusted to a suitable intensity according to the thickness of the space of the sheet-like molding die and pitch of the conductive path to be formed.

In the embodiment shown in FIG. 1, the space between the first magnets g1 may be air, but it is preferable to fill the space with a non-magnetic material such as non-magnetic stainless, aluminum, or ceramic so that the first magnets g1 can be retained at a uniform arrangement pattern.

In other words, in a preferred embodiment the first magnet g1 is embedded in the surface of a plate member 10, made of a non-magnetic material, along the formation pattern of a conductive path.

FIGS. 1 and 2 show an embodiment in which the second magnet is placed behind the above-mentioned first magnet, when seen from the space of the sheet-like molding die, and the first magnetic field and the second magnetic field are aligned in the same direction. Such an embodiment is preferable from the aspects of the constitution and workability of the apparatus for movably placing a magnet on a molding die. An embodiment in which the second magnet is disposed behind the second main wall surface (i.e., behind die member 30 forming the second main wall surface) is also acceptable.

When the second magnet is disposed behind the second main wall surface, a plate member similar to the die member 20 on the first main surface side, as explained in FIG. 1, may be used as a die member 30 forming the second main surface, so that the magnetic field generated by the second magnet will act on the space of the sheet-like molding die.

In addition, when the second magnet is disposed behind the second main wall surface, the direction of the second magnetic field is preferably the same as that of the first magnetic field. In other words, the directions of S pole and N pole are preferably determined to prevent the second magnet and the first magnet from facing each other in the same magnetic pole.

While the speed of moving the second magnet in the sheet-surface expanding direction is not limited, the conductive magnetic particles left dispersed in the flowable insulating resin are effectively drawn to the conductive path at a suitable speed determined according to the viscosity of the resin. For a resin having viscosity of 5 mPa·S, the moving rate is preferably about 50 mm/s.

The movement of the second magnet in the sheet surface expanding direction may be the movement of the second magnet from the region between the positions wherein conductive paths are formed to the position of the conductive path. In another embodiment, the second magnet can pass through the conductive path position toward the next conductive path position. This movement includes the period of the second magnet leaving from the conductive path position.

Even during the period of the second magnet leaving from the conductive path position, the ratio of the intensity of the first magnetic field and the second magnetic field only needs to be adjusted so that the conductive magnetic particles collected together to form a conductive path will not be released due to the leaving second magnetic field. Accordingly, conductive magnetic particles present in the region between the positions wherein conductive paths are formed can be irreversibly moved to the collection forming a conductive path simply by readily reciprocating the second magnet at a suitable stroke.

Any suitable mechanism can be employed to move the second magnet in the sheet surface expanding direction. Exemplary mechanisms to move the second magnet in the lateral direction include a linear motion mechanism combining an air cylinder, a rack and a pinion, a robot arm, and a linear motor.

As discussed above, the second magnet can be mechanically moved to move the second magnetic field in the sheet surface expanding direction. However, an additional embodiment for moving the second magnetic field is described below.

Figure 3:
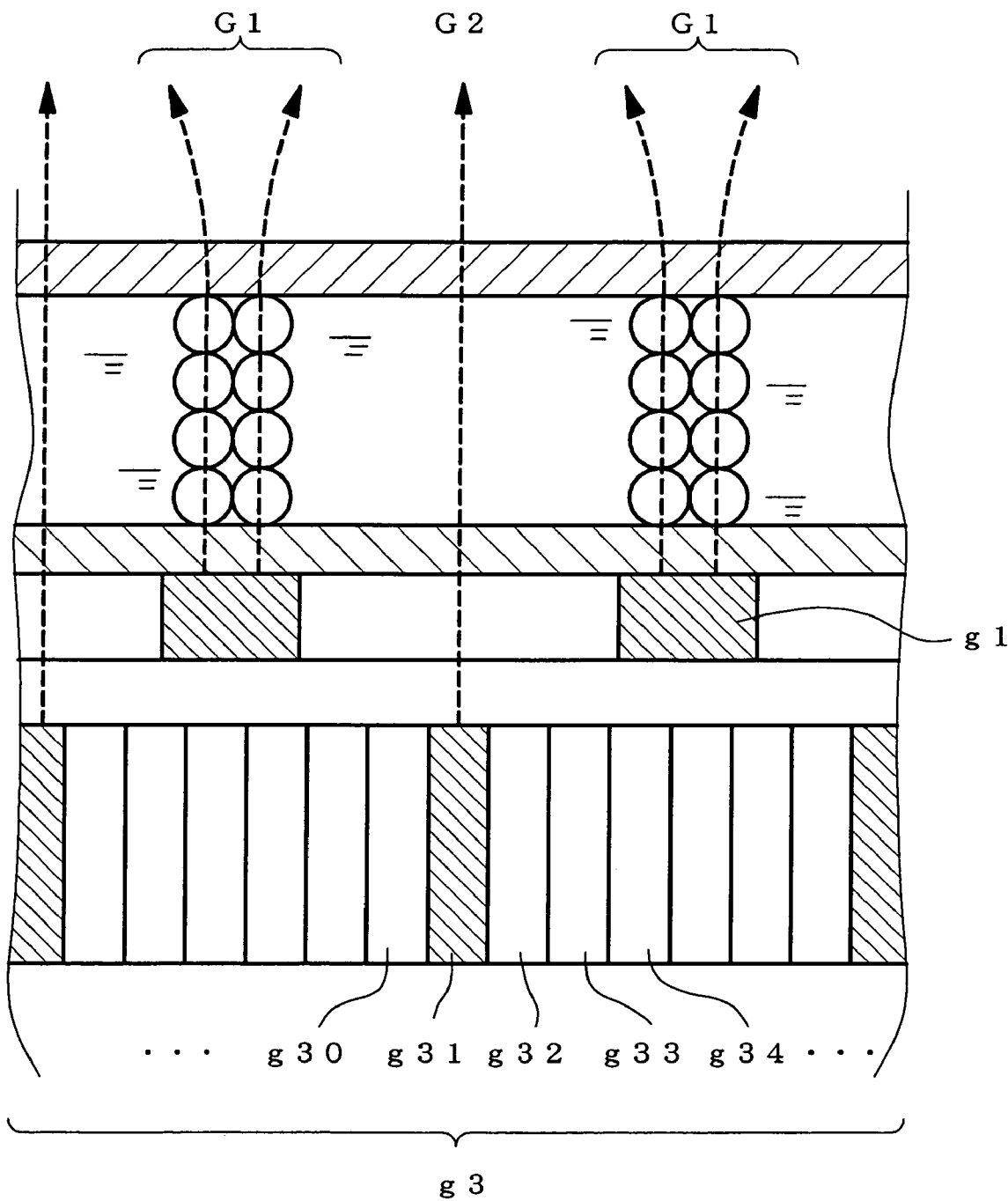
FIG. 3 shows another embodiment of the production method of the present invention, wherein multiple electromagnets are arranged as second magnets.

As shown in FIG. 3, in an alternative embodiment of the method of the present invention, multiple electromagnets as second magnets ( . . . g30, g31, g32, g33, g34 . . . ) are arranged behind the first magnet g1 in the sheet surface expanding direction and taken as one electromagnet unit g3, and activation of each electromagnet is controlled by, for example, shifting the activated electromagnet in the order of g30, g31, g32, and the like, whereby the second magnetic field is moved in the sheet surface expanding direction.

In this embodiment, the second magnetic field can be moved constantly in a certain direction more easily than in the embodiment wherein the second magnet is mechanically moved.

The application of an electric current to each electromagnet can be controlled in such a manner that the second magnetic field preferably moves in the sheet surface expanding direction.

For example, various patterns of control can be achieved when the activation is shifted from an electromagnet g31 to the next electromagnet g32 in the example of FIG. 3. In one embodiment, the electromagnet g31 may be simply stopped and the next electromagnet g32 may be then activated. In an additional embodiment, the next electromagnet g32 may be activated and then the earlier electromagnet g31 may be stopped.

In the example of FIG. 3, one of the 6 adjacent electromagnets can be activated in one period. The adjacent multiple electromagnets may be simultaneously activated or the intensity may be varied. For example, only the center of the electromagnets can be simultaneously activated to provide a magnetic field of strong intensity.

In the example of FIG. 3, the first magnet g1 may be the same as that in FIGS. 1 and 2. In addition, the above-mentioned electromagnet g3 may be disposed behind the second main wall surface.

In the above-mentioned examples, the first magnetic field and the second magnetic field are each formed using an individual exclusive magnet (i.e., a first magnet and a second magnet). However, in yet another embodiment, the first magnetic field and the second magnetic field can be generated by a common magnet, as explained below.

Figure 4:
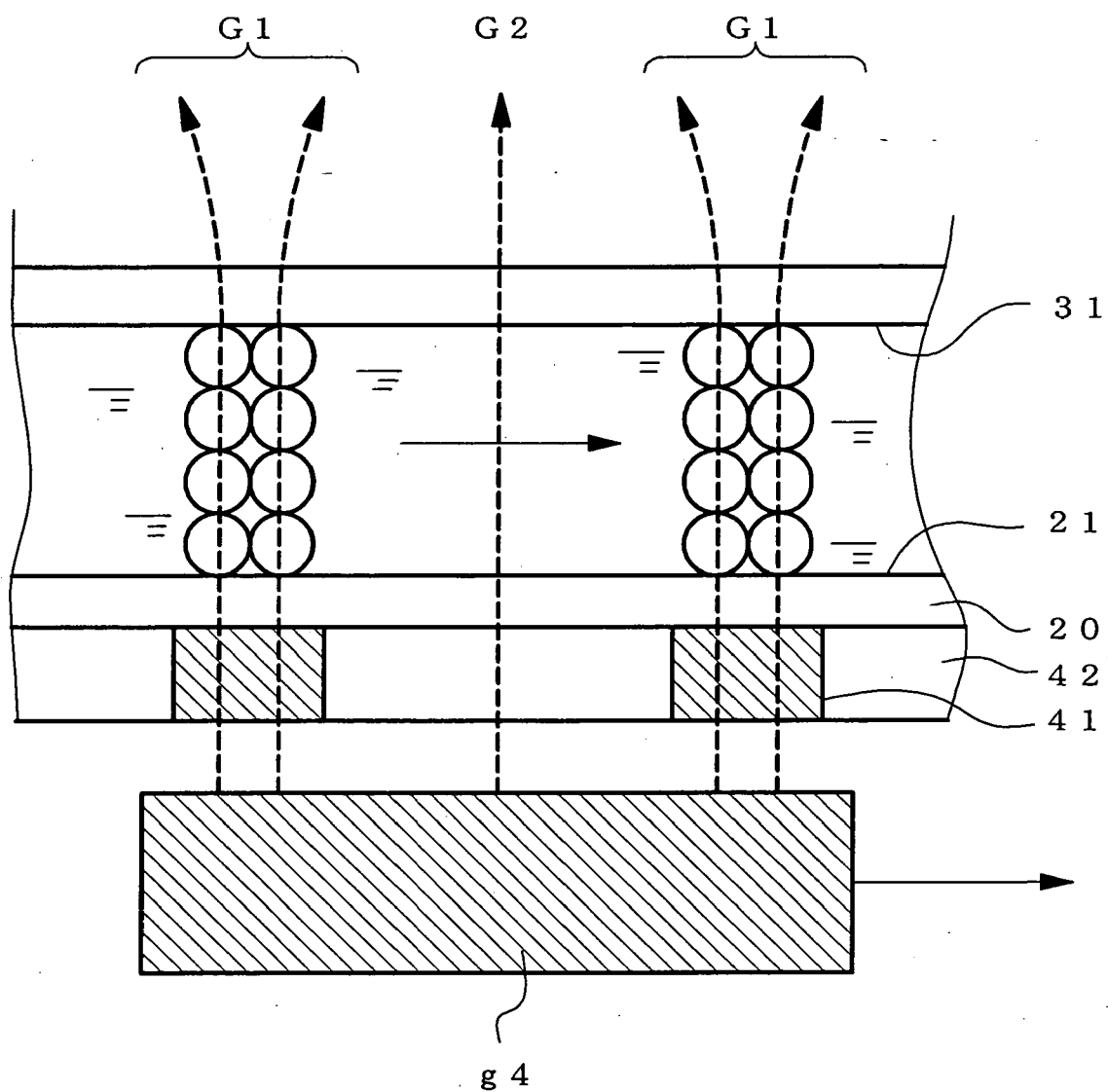
FIG. 4 shows another embodiment of the production method of the present invention, wherein the first magnetic field and the second magnetic field are generated by a common magnet.

As shown in FIG. 4, when seen from the space of the sheet-like molding die, with regard to the main wall surface 21, which is one of the two main wall surfaces 21 and 31 forming the space of the sheet-like molding die, a first material for generating the first magnetic field is disposed behind the main wall surface 21 according to the arrangement pattern of the conductive path (41 in the Figure), and a second material for generating the second magnetic field is disposed adjacent to the first material to fill the gap formed by placement of the aforementioned first material (42 in the Figure). These first and second materials 41 and 42 may penetrate a die member 20 and be exposed on the main wall surface 21, as in the embodiment of FIG. 2.

The first material and the second material both permit the passage of a magnetic field, and the first material is made to have higher permeability than the second material.

To be specific, as the first material, a material having higher permeability to a magnetic field and capable of more efficiently converging the magnetic field of magnet g4 is used, and as the second material, a material having lower permeability to a magnetic filed than the first material and permitting less passage of the magnetic field of magnet g4 than the first material is used.

In this configuration, when magnet g4 is disposed behind the first material 41 and the second material 42, and the magnet is moved in the sheet surface expanding direction (right direction shown with an arrow in the Figure), even when the magnet g4 has moved in the sheet surface expanding direction, the first magnetic field G1 that passes through the first material 41 and acts on the space of the sheet-like molding die becomes an immovable magnetic field at the fixed position, and conductive magnetic particles gather at the position to form a conductive path. The second magnetic field G2 that passes through the second material 42 in the gap and acts on the space of the sheet-like molding die moves in the lateral direction together with the movement of the magnet g4.

In other words, using only the common magnet g4, the first magnetic field G1 and the second magnetic field G2 can be made to act on the space of the sheet-like molding die, thereby enabling simultaneous performance of the above-mentioned processes (i) and (ii).

Any suitable first and second materials can be employed in the method of the present invention. Exemplary first materials include iron, nickel, cobalt, and ferrite.

While the second material is filled in the gap between the first materials, this region may be a vacuum space or filled with the air. To support the first material in a predetermined arrangement pattern, the second material is preferably a solid material. As such, exemplary solid second materials include aluminum, copper, and silica.

Figure 5:
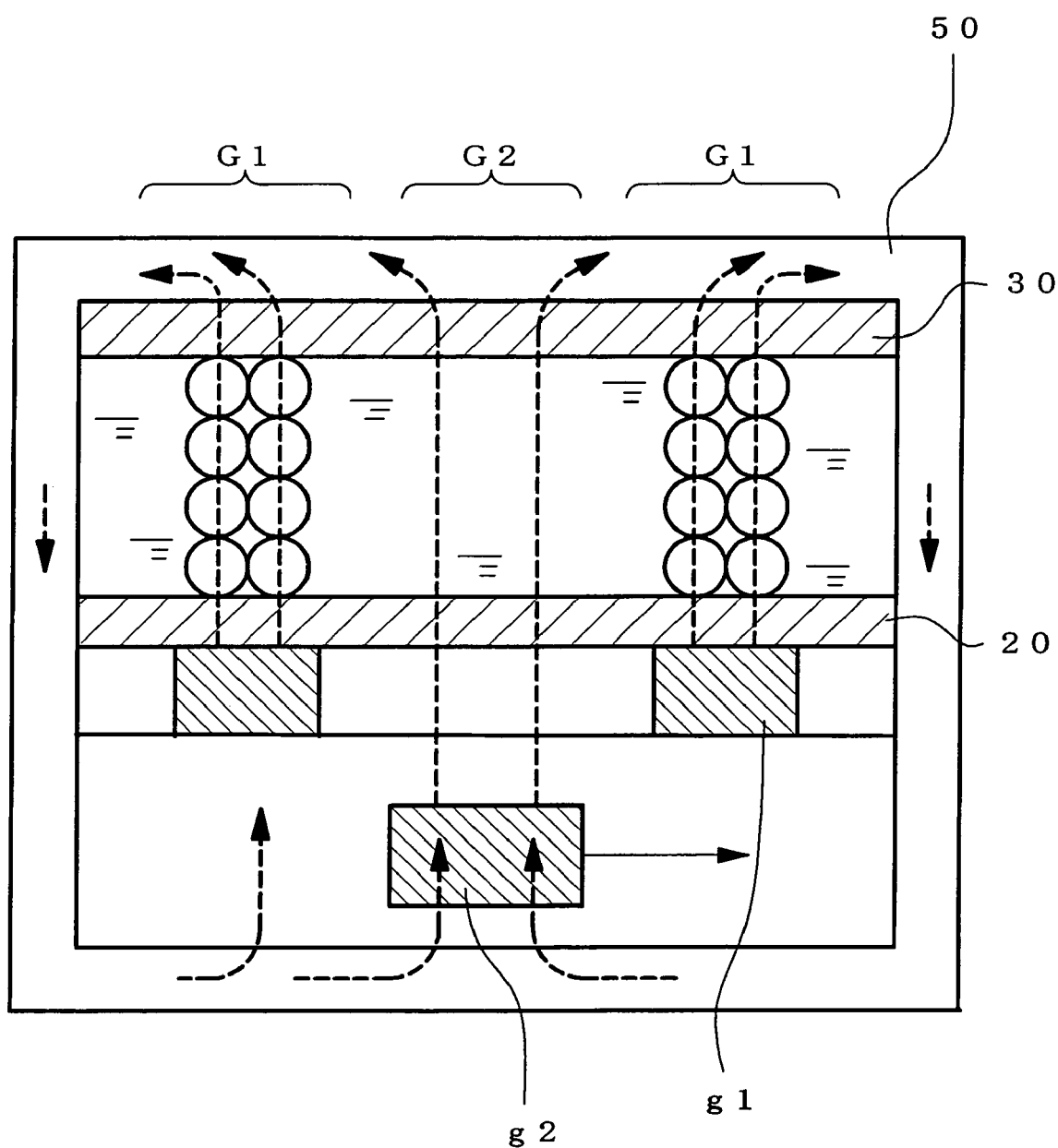
FIG. 5 shows another embodiment of the production method of the present invention, wherein the molding dies, the first magnet, and the second magnet are partially or wholly surrounded by a magnetic material.
Figure 6:
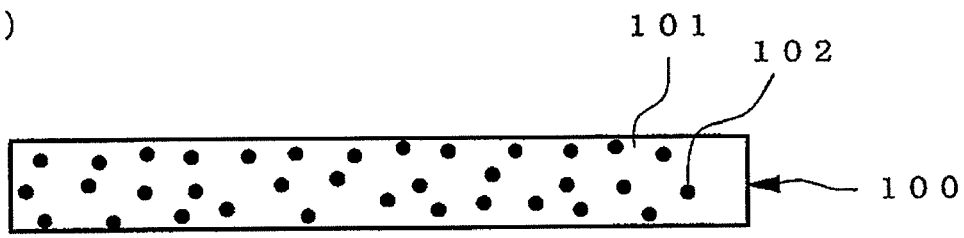
FIG. 6 is a schematic diagram of one embodiment of the structure and the state of use of a conventional anisotropic conductive sheet.
Figure 6:
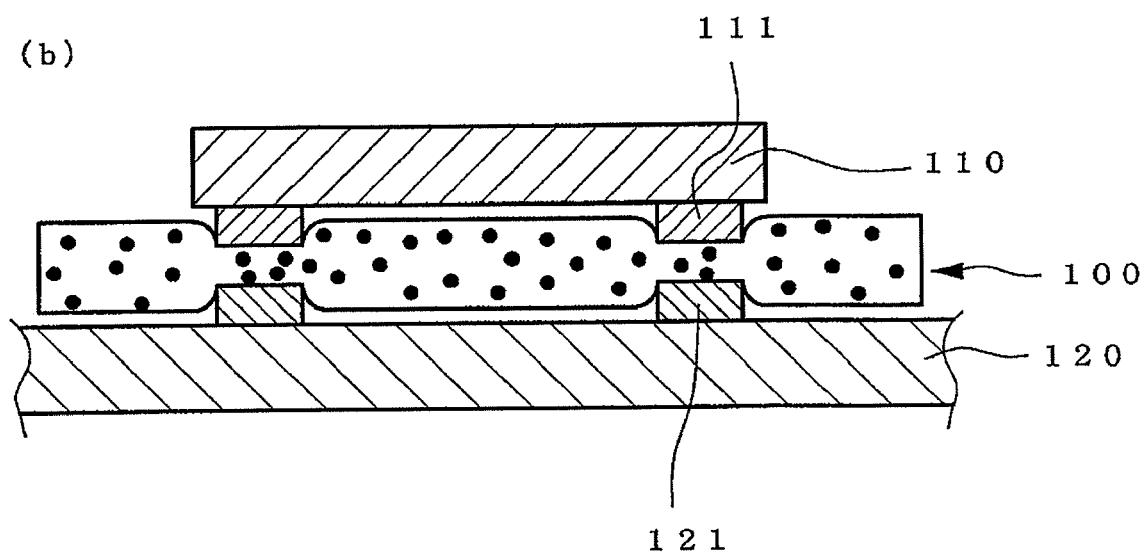
Figure 6:
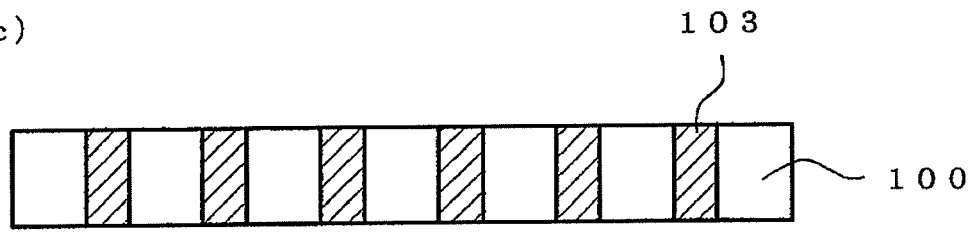
Figure 6:
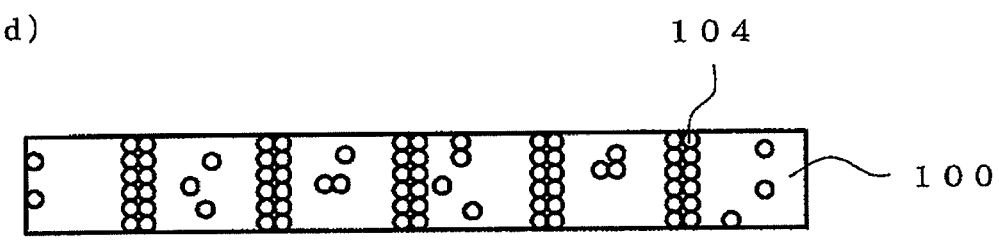
Figure 7:
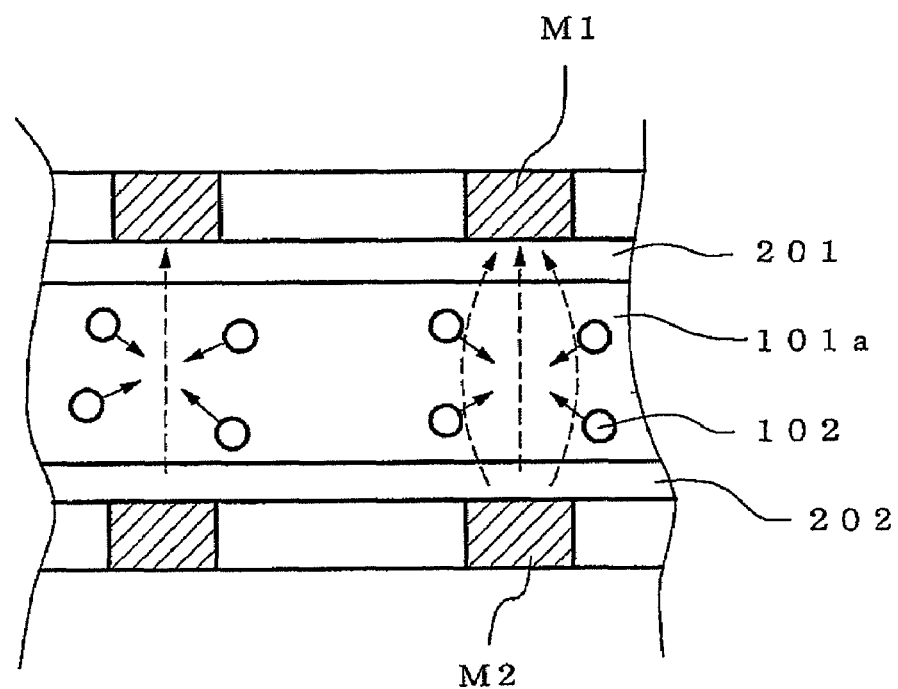
FIG. 7 illustrates the problems of conventional production methods of anisotropic conductive sheets.
Figure 7:
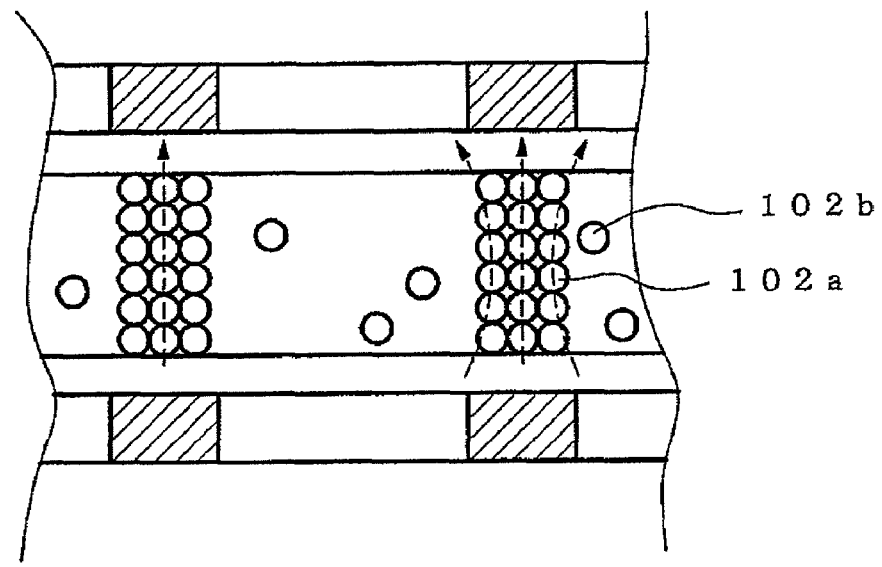

As shown in FIG. 5, at least molding dies (20 and 30), the first magnet g1 and the second magnet g2 may be partially or wholly surrounded by a magnetic material 50, so that the first magnetic field G1 and the second magnetic field G2 may act more intensely on the space of the sheet-like molded die.

It is also possible to facilitate the above-mentioned process (ii) by adding, to the flowable insulating resin in the space of the sheet-like molded die, mechanical vibration that can move the conductive magnetic particles in the sheet surface expanding direction.

Any suitable mechanical vibration can be applied in the method of the present invention. Non-limiting examples of suitable mechanical vibration include feeding vibration used in known parts feeders and vibration of piezoelectric elements used for ultrasonication motors.

EXAMPLES

Example 1

Nickel conductive magnetic particles having an average particle size of 0.3 μm were uniformly dispersed in paraffin to give a 50 μm-thick sheet-like material.

The content of the nickel particles in the whole mixture was 10% by volume.

The sheet material was sandwiched between 10 μm-thick polyester die sheets 20 and 30 from both sides, as shown in FIG. 1.

The first magnet g1 was embedded in the surface of a 1 mm-thick aluminum plate 10 according to a conductive path arrangement pattern to give a member, with which a magnetic field was to be locally applied.

The conductive path arrangement pattern included circles having a diameter of 30 μm disposed on the surface of the plate at a pitch (between centers) of 50 μm, in a closest packed manner (equilateral triangles were densely arranged).

This member was disposed behind (lower side) the sheet die member 20 in FIG. 1, and a second magnet g2 was disposed further behind.

The space in the sheet-like molded die in the above-mentioned state was warmed with hot water, and heated to 60° C. to melt paraffin.

The first magnetic field from the first magnet was allowed to act on the space in the sheet-like molded die, and a second magnet was simultaneously reciprocated in the sheet surface expanding direction to allow the second magnetic field to act on the space in the sheet-like molded die.

The application of the second magnetic field was ceased, and the paraffin was cooled while maintaining the collection of conductive magnetic particles by the first magnetic field alone, thereby solidifying the paraffin, whereby the object anisotropic conductive sheet was obtained.

Comparative Example 1

In the same manner as in the above-mentioned Example 1 except that the second magnet g2 was not used, an anisotropic conductive sheet was manufactured and used for Comparative Example.

[Evaluation]

The anisotropic conductive sheet obtained in Example 1 showed a resistance value per one conductive path of not more than 1Ω, and the insulation resistance value between conductive paths was not less than 1 MΩ by the application of DC 24V.

In contrast, the product of the Comparative Example showed a similar resistance value per one conductive path as in the product of Example 1, but the insulation resistance value between conductive paths was about 50 kΩ by the application of DC 24V, showing insufficient insulation properties.

From these tests, it has been found that, even when a material showing the same mixing ratio (conductive magnetic particles/resin) is used, an anisotropic conductive sheet having a conductive path of higher conductivity than that of conventional products and having higher insulation properties in the sheet surface expanding direction than that of conventional products can be obtained according to the production method of the present invention.

As mentioned above, the number of conductive magnetic particles left in the region between the positions wherein conductive paths are formed is decreased by doubly applying the first magnetic field and the second magnetic field in the present invention. As a result, the number of conductive magnetic particles left dispersed in the insulating resin is decreased, which in turn makes the conductive path thicker. Therefore, the anisotropic conductive sheet produced by the method of the present invention has improved conductivity in the thickness direction and insulation properties in the sheet surface expanding direction.

This application is based on a patent application No. 2004-279902 filed in Japan, the contents of which are hereby incorporated by reference.

What is claimed is:

1. A method of producing an anisotropic conductive sheet, which method comprises:
   (a) placing a flowable insulating resin in a space of a sheet-like molding die, wherein the flowable insulating resin has conductive magnetic particles dispersed therein,
   (b) simultaneously performing, relative to the space of the sheet-like molding die, the processes of
      (i) applying, in a sheet thickness direction, a first magnetic field to a position in the space of the sheet-like molding die to locally collect the conductive magnetic particles together to form a conductive path, and
      (ii) applying, in the sheet thickness direction, a second magnetic field to a region in the space of the sheet-like molding die and moving the second magnetic field in the sheet surface expanding direction to move the conductive magnetic particles in the region to the conductive path formed in process (i), and repeating processes (i) and (ii) on a different portion of the flowable insulating resin, and
   (c) solidifying the flowable insulating resin to produce an anisotropic conductive sheet comprising an insulating resin sheet and conductive magnetic particles contained in the sheet, wherein the conductive magnetic particles are locally collected together to form multiple conductive paths penetrating the insulating resin sheet in the thickness direction, wherein the process (i) is performed by placing, according to the arrangement pattern of the conductive path, a first magnet in or behind a first main wall surface of two main wall surfaces forming the space of the sheet-like molding die, when seen from the space of the sheet-like molding die, and the process (ii) is performed by placing a second magnet behind the first magnet or behind a second main wall surface opposite the first main wall surface, when seen from the space of the sheet-like molding die, and moving the second magnet in the sheet surface expanding direction.

2. The production method of claim 1, wherein the process (i) is performed by placing, according to the arrangement pattern of the conductive path, the first magnet behind the first main wall surface, when seen from the space of the sheet-like molding die, and the process (ii) is performed by placing the second magnet behind the first magnet, when seen from the space of the sheet-like molding die, and moving the second magnet in the sheet surface expanding direction.

3. The production method of claim 2, wherein a die member forming at least the first main wall surface is made of a material permitting passage of a magnetic field from behind.

4. The production method of claim 1, wherein the process (i) is performed by placing, according to the arrangement pattern of the conductive path, the first magnet behind the first main wall surface, when seen from the space of the sheet-like molding die, and the process (ii) is performed by placing the second magnet behind a second main wall surface opposite to the first main wall surface, when seen from the space of the sheet-like molding die, and moving the second magnet in the sheet surface expanding direction.

5. The production method of claim 4, wherein die members forming the first and second main wall surfaces are made of a material permitting passage of a magnetic field from behind.

6. The production method of claim 1, wherein at least the sheet-like molding die, the source of the first magnetic field and the source of the second magnetic field are partially or wholly surrounded by a magnetic material so that the first magnetic field and the second magnetic field will act more intensely on the space of the sheet-like molding die.

7. The production method of claim 1, further comprising adding mechanical vibration to the space of the sheet-like molding die to facilitate the process (ii).

8. A method of producing an anisotropic conductive sheet, which method comprises:
(a) placing a flowable insulating resin in a space of a sheet-like molding die, wherein the flowable insulating resin has conductive magnetic particles dispersed therein,
(b) simultaneously performing, relative to the space of the sheet-like molding die, the processes of
   (i) applying, in a sheet thickness direction, a first magnetic field to a position in the space of the sheet-like molding die to locally collect the conductive magnetic particles together to form a conductive path, and
   (ii) applying, in the sheet thickness direction, a second magnetic field to a region in the space of the sheet-like molding die and moving the second magnetic field in the sheet surface expanding direction to move the conductive magnetic particles in the region to the conductive path formed in process (i), and repeating processes (i) and (ii) on a different portion of the flowable insulating resin, and
(c) solidifying the flowable insulating resin to produce an anisotropic conductive sheet comprising an insulating resin sheet and conductive magnetic particles contained in the sheet, wherein the conductive magnetic particles are locally collected together to form multiple conductive paths penetrating the insulating resin sheet in the thickness direction, wherein the process (i) is performed by placing, according to the arrangement pattern of the conductive path, a first magnet in or behind a first main wall surface of two main wall surfaces forming the space of the sheet-like molding die, when seen from the space of the sheet-like molding die, and the process (ii) is performed by arranging multiple electromagnets as second magnets in the sheet surface expanding direction behind the first magnet or behind a second main wall surface opposite the first main wall surface, when seen from the space of the sheet-like molding die, and moving the second magnetic field in the sheet surface expanding direction by controlling the order of activation of individual electromagnets.

9. The production method of claim 8, wherein the process (i) is performed by placing, according to the arrangement pattern of the conductive path, the first magnet behind the first main wall surface, when seen from the space of the sheet-like molding die, and the process (ii) is performed by arranging the multiple electromagnets as second magnets in the sheet surface expanding direction behind the first magnet, when seen from the space of the sheet-like molding die, and moving the second magnetic field in the sheet surface expanding direction by controlling the order of activation of individual electromagnets.

10. The production method of claim 9, wherein a die member forming at least the first main wall surface is made of a material permitting passage of a magnetic field from behind.

11. The production method of claim 8, wherein the process (i) is performed by placing, according to the arrangement pattern of the conductive path, the first magnet behind the first main wall surface, when seen from the space of the sheet-like molding die, and the process (ii) is performed by arranging the multiple electromagnets as second magnets in the sheet surface expanding direction behind the second main wall surface, when seen from the space of the sheet-like molding die, and moving the second magnetic field in the sheet surface expanding direction by controlling the order of activation of individual electromagnets.

12. The production method of claim 11, wherein die members forming the first and second main wall surfaces are made of a material permitting passage of a magnetic field from behind.

13. The production method of claim 8, wherein at least the sheet-like molding die, the source of the first magnetic field and the source of the second magnetic field are partially or wholly surrounded by a magnetic so that the first magnetic field and the second magnetic field will act more intensely on the space of the sheet-like molding die.

14. The production method of claim 8, further comprising adding mechanical vibration to the space of the sheet-like molding die to facilitate the process (ii).

* * * * *

UNITED STATES PATENT AND TRADEMARK OFFICE
CERTIFICATE OF CORRECTION

PATENT NO. : 7,601,281 B2 Page 1 of 1
APPLICATION NO. : 11/236249
DATED : October 13, 2009
INVENTOR(S) : Masaki et al.

It is certified that error appears in the above-identified patent and that said Letters Patent is hereby corrected as shown below:

IN THE CLAIMS

Claim 13, at column 14, line 60, after "wholly surrounded by a magnetic" insert the word -- material --

Signed and Sealed this

Twenty-third Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,601,281 B2  Page 1 of 1
APPLICATION NO. : 11/236249
DATED : October 13, 2009
INVENTOR(S) : Masaki et al.

It is certified that error appears in the above-identified patent and that said Letters Patent is hereby corrected as shown below:

ON THE TITLE PAGE

(75) Inventors

Yasuo NAKATASUKA, Ibaraki-shi, Japan should read

Yasuo NAKATSUKA, Ibaraki-shi, Japan

Signed and Sealed this

Thirteenth Day of April, 2010

David J. Kappos
*Director of the United States Patent and Trademark Office*